(12) United States Patent
Gregg et al.

(10) Patent No.: US 6,218,718 B1
(45) Date of Patent: Apr. 17, 2001

(54) SPIN TRANSISTOR

(75) Inventors: John Francis Gregg, Oxford (GB); Patricia Dresel Sparks, Claremont, CA (US)

(73) Assignee: Isis Innovation Limited, Oxford (GB)

( * ) Notice: Subject to any disclaimer, the term of this patent is extended or adjusted under 35 U.S.C. 154(b) by 0 days.

(21) Appl. No.: 09/171,776
(22) PCT Filed: Apr. 28, 1997
(86) PCT No.: PCT/GB97/01167
   § 371 Date: Aug. 2, 1999
   § 102(e) Date: Aug. 2, 1999
(87) PCT Pub. No.: WO97/41606
   PCT Pub. Date: Nov. 6, 1997

(30) Foreign Application Priority Data

Apr. 26, 1996 (GB) .................................... 9608716

(51) Int. Cl.[7] .................................... H01L 29/82
(52) U.S. Cl. .................... 257/421; 257/423; 257/565
(58) Field of Search .................... 257/421, 423, 257/565

(56) References Cited

U.S. PATENT DOCUMENTS

| | | |
|---|---|---|
| 3,818,328 | 6/1974 | Zinn . |
| 5,432,373 | 7/1995 | Johnson . |
| 5,973,334 | * 10/1999 | Mizushima et al. .................. 257/25 |

OTHER PUBLICATIONS

D.J. Monsma et al., "Perpendicular Hot Electron Spin–Valve Effect in a New Magnetic Field Sensor: The Spin–Valve Transistor," Physical Review Letters, vol. 74, No. 26, Jun. 26, 1995, pp. 5260–5263.

Mark Johnson, "Spin Injector in Metal Films: The Bipolar Spin Transistor," Materials Science and Engineering B31 (1995), pp. 199–205.

Mark Johnson, "Bipolar Spin Switch," Science, vol. 260, Apr. 16, 1993, pp. 320–323.

* cited by examiner

Primary Examiner—Sara Crane
(74) Attorney, Agent, or Firm—Wenderoth, Lind & Ponack, LLP.

(57) ABSTRACT

A spin transistor is a hybrid magnetic/semiconductor transistor in which a magnetically controllable barrier is provided between a semiconductor base and collector to control the diffusion of charge carriers to the collector. With the spin transistor, the charge carrier populations are distinguished by the direction of the spin or magnetic moment of the carriers instead of the electronic charge. A spin injector is used to spin polarize the charge carrier population so that the population has a selected magnetic moment which population may or may not be enabled to flow to the collector via the magnetic barrier. The spin transistor utilizes the electronic characteristics of a conventional semiconductor transistor in combination with a carrier flow controlled by magnetic moment to maximize gain.

19 Claims, 1 Drawing Sheet

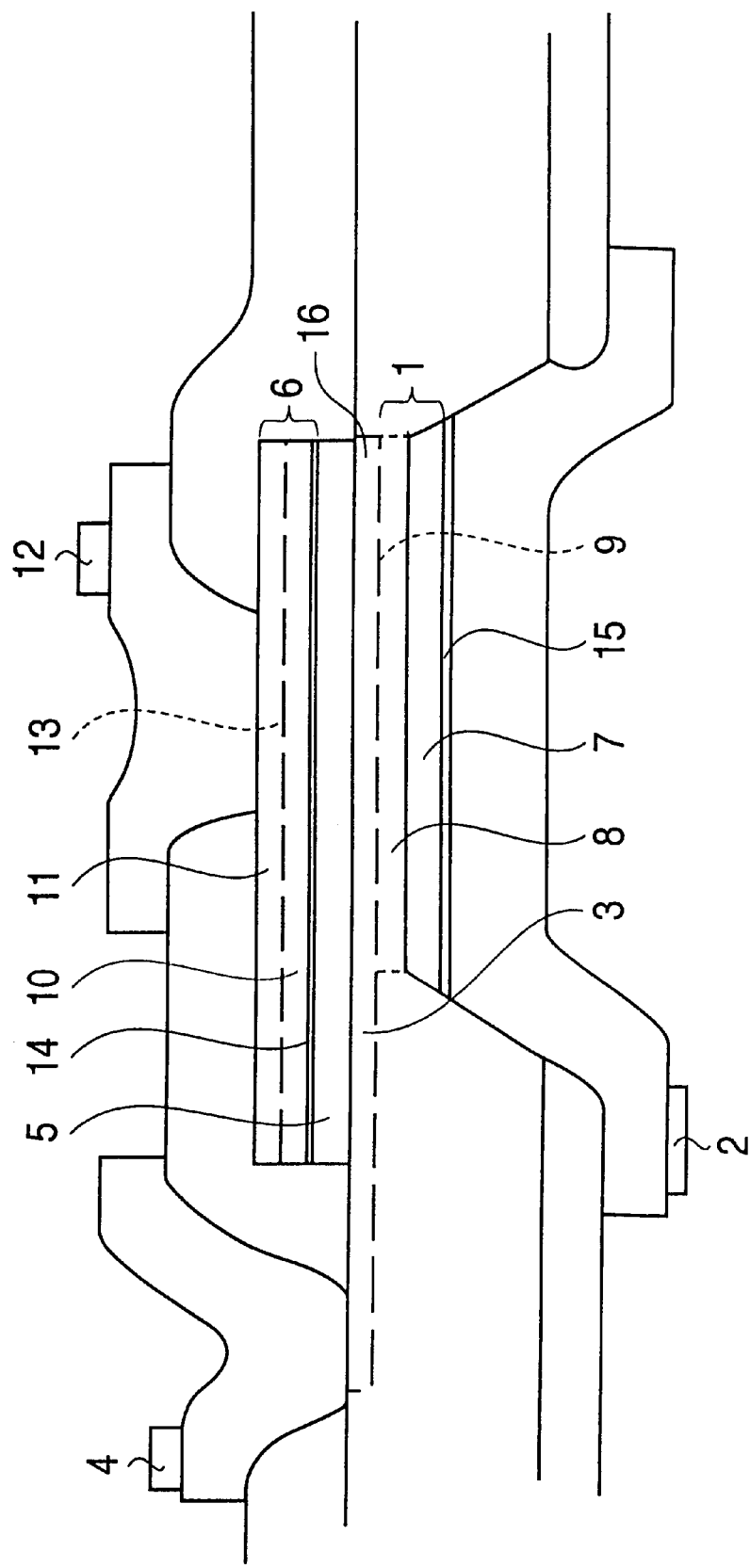

SPIN TRANSISTOR

BACKGROUND OF THE INVENTION

The present invention relates to a spin transistor which is a transistor which relies upon two separate populations of charge carriers distinguished by the direction of the spin or magnetic moments of the carriers in the same way that in a conventional semiconductor transistor the carrier families are distinguished by their having different effective electrical charges.

The original spin transistor, or magnetic transistor as it is also known, is described in Science, 260, 320 Apr. 16, 1993, Bipolar Spin Switch by M Johnson. The spin transistor described in this journal report was derived from a metallic, giant magnetoresistance (GMR) magnetic trilayer with contacts to each of three layers. The transistor is biased so as to pump a spin polarized current from one of the magnetic layers into a base layer; the latter suffers a consequent divergence in the chemical potentials of the up and down spin channels and this in turn induces magnetically dependent current flow in a collector (the second magnetic layer). This spin transistor design has a significant problem with its practical implementation in that the transistor offers no power gain. Also, the voltages involved are of the order of nanovolts.

More recent developments in the spin transistor are described in Phys. Rev. Lett., 74, 26, 5260, (1995), D J Monsma et al. The spin transistor described in this journal paper is a metal-semiconductor hybrid in which the rectifying properties of semiconductor junctions are exploited. The transistor consists of two layers of silicon which sandwich a metal GMR multilayer. The transistor is biased to pass current from one silicon layer to the metal multilayer stack and the latter's magnetic configuration then governs what proportion of the current eventually penetrates to the second silicon layer. In this respect, the multilayer stack operates as a normal magnetic multilayer which has a large resistance in a low magnetic field and a small resistance in a high magnetic field. The current gain of the transistor is magnetically controllable by a factor of around 2, with the GMR of the multilayer on its own being only about 3%. Even with this design, however, while the collector/base current gain $\beta$ varies by a large factor, its actual value is very small and, in fact, is less than unity, whereas for a commercial silicon transistor $\beta$ is generally 200 or more.

SUMMARY OF THE INVENTION

The present invention is a further development of the spin transistors described above which seeks to increase the gain $\beta$ of the transistor to a value greater than unity. To achieve this, the present invention relies on the generation of a spin polarized diffusion current which is controlled by means of a magnetically controlled barrier such as a switchable density of states for example.

The present invention provides a spin transistor comprising a hybrid semiconductor emitter, base and collector, wherein the emitter includes spin polarizing means for spin polarizing the charge carriers at the emitter, and a magnetically controllable barrier provided between the base and collector to control the arrival of charge carriers at the collector.

Thus, the charge carrier populations in the spin transistor are distinguished by magnetic moment instead of electrical charge.

Preferably, a semiconductor bridge containing a charge carrier diffusion layer, which essentially forms the base, is provided, the charge carrier diffusion layer being formed between the emitter and the collector. Preferably, a p-n junction is formed between the emitter and the base and the other side of the base abuts the magnetically controlled barrier. The semiconductor bridge is ideally in the form of a membrane having a thickness of less than 1 $\mu$m. The magnetically controllable barrier has a thickness less than the spin diffusion length of the carriers and presents different bandstructures to the carriers in dependence on an externally applied magnetic field.

Additionally, the spin polarizing means preferably includes a layer substantially consisting of cobalt or Chromium dioxide and exchange pinning means which may be comprised of a layer of an alloy of manganese and iron in contact with the cobalt layer.

P-n and n-p junctions are provided between the emitter and base and between the barrier and collector connection. Ideally, the magnetically controllable barrier is in contact with the p-n junction and this junction between the barrier and the p-n junction functions as a Schottky or as an Ohmic barrier. A metallic layer may also be provided between the magnetically controllable barrier and the p-n junction preferably of silver, which may improve the characteristics of the barrier.

Furthermore, the magnetically controllable barrier may extend beyond the area of the spin polarizing means and may consist of a material including chromium dioxide. Ideally, the magnetically controllable barrier consists of a layer of chromium dioxide and the diffusion layer extends beyond the area of the spin polarizing means and the magnetically controllable barrier.

In a preferred embodiment, the emitter and the spin polarizing means are provided on a first side of a semiconductor wafer and the base, the collector and the magnetically controllable barrier are provided on a second side of the semiconductor wafer.

A further aspect the present invention provides a method of fabricating a spin transistor comprising: providing a semiconductor wafer; etching the wafer to form a pit on a first surface of the wafer; forming a p-n junction in a semiconductor bridge between the base of the pit and an opposing second surface of the wafer with at least one of the p and n doped regions forming the junction extending beyond the area of the pit; forming a layer of a spin polarizing material in the base of the pit, and establishing an electrical connection to the spin polarizing layer, forming a magnetically controllable barrier layer on the second surface of the wafer over the p-n junction in the semiconductor bridge; establishing an electrical connection to the magnetically controllable barrier layer; and establishing an electrical connection to that portion of the p or n doped regions extending beyond the area of the pit.

The method may further comprise forming an exchange pinning layer on the spin polarizing material; forming a p-n junction on a separate semiconductor wafer and coating with silver; coating the magnetic barrier layer with silver; cold welding the two silver layers to form the transistor structure; and making a contact to the p-n junction structure on the second wafer on the side opposite to the silver layer.

BRIEF DESCRIPTION OF THE DRAWING

FIG. 1 illustrates an embodiment of the present invention.

DETAILED DESCRIPTION OF THE INVENTION

An embodiment of the present invention will now be described by way of example with reference to FIG. 1 which is a schematic diagram of a spin transistor in accordance with the present invention.

In its most basic form the transistor shown in FIG. 1 is a three terminal device consisting of a spin injector 1 with an emitter connection 2, a diffusion layer 3 with a base connection 4, a magnetic barrier 5 and a collector 6. One or more of these may be formed from thin films which in this context are intended as reference to layers having thickness of around 0.3 nm to 1000 nm or, more preferably, 1 nm to 100 mnm.

The spin injector 1 consists of two layers: a magnetic material 7 with exchange split conduction bands in electrical contact with a film of doped semiconductor material 8. Either or both of these layers may be in the form of thin films. The magnetic material 7 of the spin injector is exchange pinned by an exchange pinning layer 15 so that its magnetic orientation is independent of an externally applied magnetic field. Also, ideally, the contact is engineered to minimize band-bending in the semiconductor layer 8. The magnetic material 7 may be a 3$d$ magnetic metal such as iron, nickel or cobalt. Alternatively, an alloy of palladium and iron may be used in which case the exchange field may be tuned by varying the iron concentration. High spin polarization materials which are non-metallic, such as manganese perovskite based material or chromium dioxide or Heusler alloys may also be employed.

The diffusion layer 3 may consist of a moderately doped n or p type semiconductor (p type doping is shown in FIG. 1). The diffusion layer 3 forms part of a p-n junction 9 which acts as a bridge from the spin injector 1 to the diffusion layer 3. The p-n junction 6 is forward biased to inject a diffusion current of spin polarized minority carriers from the spin injector 1 into the diffusion layer 3. The diffusion layer 3 extends beyond the area of the spin injector 1 in the direction of the base connection. By extending the diffusion layer 3 in this way, the gain β of the spin transistor is enhanced. In practice, space considerations will limit to what extent the diffusion layer 3 is made larger than the spin injector 1.

The junction between the diffusion layer 3 and the magnetic barrier layer 5 is ohmic to preclude band-bending in the diffusion layer 3 which might otherwise interfere with the magnetic switching of the collector current. So as to ensure an ohmic contact materials of compatible work functions should be used. For example, where the diffusion layer 3 is of silicon, cobalt is a suitable material for the magnetic barrier layer 5 as cobalt and silicon have work functions which are sufficiently similar that they may be matched by trimming the doping of the silicon diffusion layer. The magnetic barrier layer 5 has a thickness less than the spin diffusion length (i.e. several atomic layers).

Placing the magnetic barrier layer 5 in electrical contact with the diffusion layer 3 means that the spin polarized diffusion current incident upon it has a thermal energy spread of just 0.025 eV for a room temperature device. The exchange splitting in the magnetic barrier layer is larger than this (of the order of 0.1 eV or larger) and presents a substantially different bandstructure to the diffusion current depending on whether the magnetic layer 7 is aligned parallel or antiparallel with the magnetic barrier layer 5. In turn, this gives rise to different spin transmission coefficients exactly as in the case of spin dependent interface scattering in a GMR sample. Alternatively, a magnetic barrier having a strong spin asymmetry in the density of states for the respective channel may be provided for example by using a doped manganese perovskite barrier or chromium dioxide or some of the semi-metal Heusler alloys such as PtMnSb in which the density of states for one spin channel is totally suppressed. Ideally total reflection of one spin polarization would be provided. Alternatively a magnetically controllable Schottky barrier is provided.

The collector 6 consists of two layers 10, 11 of oppositely doped semiconductor either or both of which may be in the form of thin films. The first semiconductor collector layer 10 has the same doping as the diffusion layer 3 to band-match it to the magnetic barrier layer 5. The second semiconductor collector layer 11 is in ohmic contact with the collector connection 12. The two semiconductor collector layers 10, 11, at their junction, form a reverse biased p-n junction 13 which captures those spin polarized carriers which have penetrated the magnetic barrier 5. A thin nonmagnetic metal layer 14, probably silver, may be inserted between the magnetic layer 5 and the semiconductor layer 10 to facilitate assembly by cold welding.

It should be noted that the band structure of the overall device is such that the same magnetic material would probably not be used for both the spin injector 1 and the magnetic barrier layer 5. This is a result of the need to address the problem of band bending at the interface between the magnetic and semiconductor materials and because the latter have different doping levels owing to the presence of the p-n junction between the spin injector 1 and the diffusion layer 3. Various combinations of magnetic and semiconductor materials may be employed in dependence on the particular performance requirements of the spin transistor, for example, the transistor may run with electron or hole minority currents.

The spin transistor shown in FIG. 1 can be constructed in the following manner. A wafer of intrinsic silicon is etched using conventional techniques to form one or more pits in its rear surface. Each pit provides the structure for the formation of a single spin transistor The pit is etched sufficiently deep that the wafer thickness between the base of the pit and the upper surface of the wafer is preferably less than 1 μm. The region of the wafer between the pit and the upper surface of the wafer forms a membrane or bridge 16 which contains the diffusion layer for the spin transistor.

The top surface of the wafer is masked to define a region, larger than and which encompasses the area of the membrane, which is then doped with p-type material using conventional ion implantation or diffusion techniques. Thus, the doping extends over the entire area of the membrane and at least to one side of the membrane as seen in FIG. 1 The p doped region of the upper surface of the wafer forms the diffusion layer 3 of the spin transistor. The base of the pit is then doped with n-type material, through suitable masking of the rear surface of the wafer, also employing conventional techniques The doping from each side of the wafer is controlled so that the entire depth of the membrane region is doped with either p-type or n-type material thereby forming the p-n junction 9. Preferably, approximately 50% of the thickness of the membrane is doped with p-type material and 50% of the membrane thickness with n-type material.

The top surface of the wafer is then cleaned to remove residual silicon dioxide contaminating the surface. A layer of chromium dioxide is formed on the upper surface of the wafer so that it overlies a substantial portion, but not all, of the doped upper surface of the wafer. Preferably, the chromium dioxide layer wholly overlies the membrane region of the wafer. The chromium dioxide layer may be formed by applying a layer of chromium trioxide or $Cr(CO)_B$ which is subsequently reduced to dioxide. This layer functions as the magnetic barrier layer 5.

After the chromium dioxide layer 5 is formed, polysilicon is sputtered over the upper surface of the layer 5. The polysilicon layer is doped with p-type material and then, a further layer of polysilicon is applied over the top which is doped with n-type material to form the collector 6. It is not essential in all cases for a p doped layer to be provided immediately above the layer 5, in which case the polysilicon layer is sputtered over the top of the chromium dioxide layer and then doped with n-type material.

A layer of silicon dioxide is then formed over the entire as surface of the wafer using any suitable conventional technique. The silicon dioxide layer is masked and etched to separately expose a portion of the upper surface of the collector 6 and a portion of the p-doped region of the upper surface of the wafer, preferably furthest from the membrane. A layer of gold is then applied over the entire surface of the structure and portions of the gold are subsequently lifted off using conventional techniques to define the collector 12 and base 4 connections and bonding pads.

A layer of silver 14 may be provided between the chromium dioxide layer 5 and the polysilicon so as to improve the electrical properties of the junction which is formed between the two layers.

Where the collector structure and the emitter/base structure are formed on two different wafers of silicon and then joined, the layer of silver 14 is made in two halves, one on each of the two surfaces to contacted together and the silver coatings then have the additional purpose of facilitating assembly by enabling the cold welding of the two separate silver coatings together to form the silver layer 14. One coating of silver is applied to the non-doped or p-doped surface of the collector 6 A second, similar coating is applied to the upper surface of the chromium dioxide layer 5 and the two layers of silver are then cold welded together. The subsequent steps for forming the base and the collector connections are then performed in the same manner as described above.

Once the base and collector connections are formed the remaining structure of the spin transistor is formed on the rear of the wafer. The rear surface of the wafer including the pit is cleaned to remove contaminants and then a layer of cobalt is formed in the base of the pit using conventional techniques such as sputtering, evaporation or laser ablation. The layer of cobalt forms the magnetic layer 7 of the spin transistor. A layer of an alloy of manganese and iron is then formed over the exposed surface of the cobalt layer 7 in the pit, again using a suitable conventional technique such as evaporation or sputtering. The manganese/iron layer 15 acts as an exchange pinner in the spin transistor.

The rear surface of the wafer and the pit is cleaned again and then a layer of silicon dioxide is applied over the entire surface. The silicon dioxide is etched to expose the surface of the manganese/iron layer 15 and a layer of gold is applied over the exposed surface of the layer 15 and the exposed surface of the silicon dioxide. Portions of the gold layer are subsequently removed to form the emitter connection 2 and bonding pad.

It will be apparent that in practice, a plurality of spin transistors would be fabricated simultaneously in respective pits in a single wafer. Also, it is to be understood that methods other than those described for fabricating the various elements of the spin transistor may be employed as appropriate.

In use, the transistor is biased so that a spin polarized current flows from the spin injector 1 to the diffusion layer 3. This is analogous to the emitter-base current of a conventional semiconductor bi-polar device in which the gain $\beta$ is controlled by the base layer geometry which ensures that a large fraction of the diffusing current carriers from the emitter cross the back-biased base-collector junction rather than the base connection 4. With the spin transistor shown in FIG. 1, the magnetic configuration of the barrier layer 5 is variable in dependence on an externally applied magnetic field. Depending upon the magnetic configuration of the barrier layer 5 with respect to the magnetic layer 7 in the spin injector 1 (i.e. parallel or antiparallel) the diffusion current in the diffusion layer 3 is presented with different bandstructures In one magnetic configuration this deters the minority carriers from crossing the base-collector junction and instead the carriers pass to the base connection 4. In the other magnetization state, the minority carriers cross the base-collector junction and plunge down into the collector 6, thereby recovering the full $\beta$ of a conventional transistor Thus, the spin transistor shown in FIG. 1 has a gain $\beta$ greater than unity whose value is externally controllable by application of a magnetic field which reorients the magnetic barrier.

The gain $\beta$ is enhanced by extending the barrier layer 5 beyond the area of the injector 1 in the direction of the base connection 4.

In an adaptation of the spin transistor, an electrical connection may be provided to the magnetic barrier layer 5 to enable the gain or 'height' of the barrier to be adjusted.

With the spin transistors described above, the diffusion current is prepared in a polarized state before being injected into the diffusion layer. What decides whether the diffusion current passes to the collector is determined on the basis of the presence or absence of a thin magnetically controlled barrier between the diffusion layer and the collector rather than passage through a thick magnetic multilayer as with known devices Importantly, with the spin transistor described the electric potential drops present in the base layer are small in comparison with the thermal spread (1/40 eV) of the carriers. This ensures that at all times the carriers diffuse and also as the barrier layer is only a few atoms thick, a current gain is recovered which approaches that of a normal silicon bipolar transistor and is therefore much greater than unity. Furthermore, where a semi-metal is employed in the barrier layer, the difference between the two spin channels is enhanced since it is the ratio of a ballistic hot electron current in the semi-metal to a tunneling current in the semi-metal.

The spin transistors described above may be used as a replacement in conventional semiconductor chip applications such as memory storage where spin transistors have the advantage that they do not require power to maintain the memory state. Additionally, spin transistors are suitable for use as sensors such as magnetic field sensors and position or speed sensors and as hard disc readheads. Also, the control of brushless dc motors may usefully include spin transistors.

A further useful application of the spin transistors is in field programmable gate arrays (FPGA) where they offer the advantages of reprogrammability, non-volatility, no continual memory refresh needed, no external memory required, smaller space per gate needed on chip than with existing FPGAs, low power consumption, direct magneto-optical programming instead of sequential programming, hence higher programming speed.

What is claimed:

1. A spin transistor in which charge carrier populations are distinguished by magnetic movement, said spin transistor comprising:

a base;

a collector;

an emitter having a spin polarizing means for spin polarizing charge carriers at said emitter; and a hybrid semiconductor structure comprising:
- a magnetically controllable barrier located between said base and said collector, said magnetically controllable barrier operable to control a diffusion of charge carriers to said collector, and
- a semiconductor layer including said base and providing a bridge between said emitter and said collector via said magnetically controllable barrier.

2. A spin transistor according to claim 1, wherein the charge carrier populations are distinguished by magnetic movement.

3. A spin transistor according to claim 1, wherein said base is operable to receive a spin polarized diffusion current.

4. A spin transistor according to claim 1, wherein said semiconductor layer comprises a charge carrier diffusion layer between said emitter and said collector.

5. A spin transistor according to claim 1, wherein said semiconductor layer is doped to form a p-n junction between said emitter, said base and said collector.

6. A spin transistor according to claim 1, wherein said spin polarization means comprises a layer substantially consisting of cobalt.

7. A spin transistor according to claim 6, wherein said spin polarization means further comprises exchange pinning means.

8. A spin transistor according to claim 7, wherein said exchange pinning means comprises a layer of an alloy of manganese and iron in contact with said layer substantially consisting of cobalt.

9. A spin transistor according to claim 1, further comprising a p-n junction, wherein said magnetically controllable barrier is in electrical contact with said collector via said p-n junction.

10. A spin transistor according to claim 9, further comprising a junction between said magnetically controllable barrier and said p-n junction, said junction operable to function as a Schottky barrier.

11. A spin transistor according to claim 9, further comprising a junction between said magnetically controllable barrier and said p-n junction, said junction operable to function as a Ohmic barrier.

12. A spin transistor according to claim 10, further comprising a metallic layer provided between said magnetically controllable barrier and said p-n junction.

13. A spin transistor according to claim 10, wherein said metallic layer is silver.

14. A spin transistor according to claim 1, wherein said magnetically controllable barrier extends beyond an area of said spin polarization means.

15. A spin transistor according to claim 1, wherein said magnetically controllable barrier comprises chromium dioxide.

16. A spin transistor according to claim 15, wherein said magnetically controllable barrier comprises a layer of chromium dioxide.

17. A spin transistor according to claim 4, wherein said magnetically controllable barrier extends beyond an area of said spin polarization means and said charge carrier diffusion layer extends beyond the area of said spin polarization means and said magnetically controllable barrier.

18. A spin transistor according to claim 1, further comprising a semiconductor wafer having first and second sides, wherein said emitter and said spin polarization means are provided on said first side and said base, said collector and said magnetically controllable barrier are provided on said second side.

19. A spin transistor according to claim 11, further comprising a metallic layer provided between said magnetically controllable barrier said p-n junction.

* * * * *